United States Patent
Aulicino et al.

[11] Patent Number: 6,030,889
[45] Date of Patent: Feb. 29, 2000

[54] SUBSTRATE-HOLDING FIXTURE OF NON-WETTABLE MATERIAL

[75] Inventors: Anthony M. Aulicino, North York; Robert J. Lyn, Richmond Hill, both of Canada

[73] Assignee: International Business Machines Corporation, Armonk, N.Y.

[21] Appl. No.: 08/859,546

[22] Filed: May 20, 1997

Related U.S. Application Data

[62] Division of application No. 08/558,577, Oct. 31, 1995, Pat. No. 5,658,827.

[30] Foreign Application Priority Data

Sep. 11, 1994 [CA] Canada ................................ 2135508

[51] Int. Cl.[7] ................................................ H01L 21/288
[52] U.S. Cl. ........................ 438/613; 438/615; 29/25.01; 228/180.22
[58] Field of Search ..................................... 438/613, 615; 29/25.01; 228/180.22; 257/737, 738

[56] References Cited

U.S. PATENT DOCUMENTS

| | | |
|---|---|---|
| 4,412,642 | 11/1983 | Fisher, Jr. . |
| 4,914,814 | 4/1990 | Behun et al. . |
| 5,024,372 | 6/1991 | Altman et al. . |
| 5,395,040 | 3/1995 | Holzmann . |
| 5,480,835 | 1/1996 | Carney et al. . |
| 5,539,153 | 7/1996 | Schwiebert et al. . |
| 5,565,033 | 10/1996 | Gaynes et al. . |
| 5,586,715 | 12/1996 | Schwiebert et al. . |
| 5,593,080 | 1/1997 | Teshima et al. . |
| 5,782,399 | 7/1998 | Lapastora . |

Primary Examiner—David E. Graybill
Attorney, Agent, or Firm—Lawrence R. Fraley

[57] ABSTRACT

A method for forming solder ball contacts on a Ball Grid Array (BGA) is described. The solder balls are formed by squeegeeing solder paste through apertures in a fixture into contact with pads on a substrate, and heating the fixture, paste and substrate to reflow the solder paste into solder balls that attach to the pads and are detached from the fixture. After cooling, the fixture is readily separated from the substrate while leaving the solder balls in positive (conductive) contact with contact pads on the substrate.

4 Claims, 7 Drawing Sheets

FIG.10D

SUBSTRATE-HOLDING FIXTURE OF NON-WETTABLE MATERIAL

This is a divisional of application Ser. No. 08/558,577 is now U.S. Pat. No. 5,658,827 filed on Oct. 31, 1995.

TECHNICAL FIELD

The present invention provides a simple and reliable method for forming solder ball contacts on a densely packed contact grid array.

BACKGROUND OF THE INVENTION

The need for high density connections in integrated circuit devices has led to the development of ball grid array packages which require large numbers of solder ball connections in a small area. This has typically been achieved by the robotic pick-and-place of small standard sized eutectic solder spheres onto precise locations on the package. Such a method is understandably very costly and requires specialized equipment and materials.

The present invention overcomes the difficulties of such a method by providing a solder screening method that avoids the need to precisely pick up extremely small solder balls and locate these on the package. The method enables solder balls to be formed from the paste directly on the package.

The present invention provides a method of forming solder connections on a substrate by placing a fixture over the substrate and screening solder paste onto the substrate through the fixture. The fixture is made of a material that is non-wettable by the solder and forms solder balls at the contact sites on the substrate when the solder is reflowed. Some suitable materials which are not wettable by the solder are titanium, molybdenum and graphite.

U.S. Pat. No. 4,914,814 describes a process for forming pins on a ceramic substrate carrier. A non-wettable pin mold having an array of pin holes is placed over the carrier and the pin holes are filled with high temperature melting point solder balls or solder wires. The pin mold is formed of a material having a thermal coefficient of expansion matching that of the substrate and is non-wettable by the solder. A preferred mold material in the patent is graphite. The pin mold and substrate carrier are then passed through a high temperature furnace to form the solder pin connections on the substrate. The mold is then removed and the substrate carrier assembly is then mounted on an organic circuit board with connections made through low melting temperature solder paste to pads on the board. This patent requires the use of pre-formed solder balls or wires. Among other differences, the present invention screens a solder paste through a fixture or mask. This provides more flexibility in the design as the solder ball size can be readily modified, solder paste being much easier to apply and use.

U.S. Pat. No. 5,211,328 describes a process where a transfer member is formed from graphite, ceramic or titanium with a plurality of holes located therein. The holes are precisely aligned with contact locations on a substrate. Solder is squeegeed into the holes and the transfer member placed in precise position on the substrate and the solder reflowed to form contacts at the contact sites. The transfer member is non-wettable by the solder. This patent differs in one aspect from the present invention in that the solder is squeegeed onto the transfer member and then brought into position on the substrate, whereas in the present invention, the fixture is placed on the substrate before solder is deposited into the holes in the fixture. This feature alone provides a more flexible and reliable process than the one described in the patent.

U.S. Pat. No. 5,024,372 describes a method of forming high density solder bumps on a substrate. According to this patent, solder bumps are formed by squeegeeing solder paste through a stencil or placing solder balls in precise locations on the substrate. The stencil process has limited density due to slumping of the paste when the stencil is removed. Placement of the solder balls creates a reliability problem as it is difficult to ensure that solder balls are precisely located at the appropriate locations. This patent attempts to overcome these problems by the use of a thick layer of photo-definable solder resist which is selectively removed to provide wells at solder pads on the substrate. Solder paste is squeegeed into the wells and the solder reflowed. The solder paste wets and wicks to the metalized pads on the substrate and the resist is then removed to leave solder bumps on the metalized pads. By reflowing the solder while the non-wettable fixture remains in place, the present invention overcomes the problems of slumping while providing a fixture that is readily detached from the substrate without the need of such techniques as those required in this patent. Additionally, the present invention does not require the melting point of the solder to be lower than that of the contact pad on the substrate, as is required in this patent.

U.S. Pat. No. 4,412,642 describes aprocess for casting solder leads onto a leadless chip carrier. A molding plate having a plurality of mold cavities at predetermined locations each receive a solder preform. The preform is spherical and the cavities are tapered. The plate and solder preforms are subjected to heat and pressure which is applied to the preforms to force the solder preforms into the cavities. The molding plate with the leads is then mounted adjacent a leadless chip carrier with the solder leads aligned with contact areas on the carrier. The carrier and the mold plate are heated to reflow the solder and transfer the solder to the contact areas of the carrier. The molding plate may be made of titanium to prevent wetting contact with the solder and therefore facilitate release of the solder onto the carrier. However, the process described in this patent requires the use of expensive solder preforms, as opposed to relatively less expensive solder paste. Additionally, the present invention assures that the size of the solder balls ultimately produced is controlled by the size of the apertures in the fixture. In contrast, U.S. Pat. No. 4,412,642 requires the solder preform to be determinative of the size of the connector.

U.S. Pat. No. 5,284,287 describes a vacuum tool that picks up solder balls and places these in position for soldering. The solder balls are aligned by a vacuum tool.

U.S. Pat. No. 4,712,721 describes systems for delivering preformed solder to contact sites. The preformed solder shapes are held in a positioning means which is adapted to hold the solder. The positioning means is placed in a fixture and the solder reflowed to form connections to a chip carrier package or the like. The patent does not use a stencil or template to locate the solder.

U.S. Pat. No. 3,647,533 describes a process for forming bonding bumps on a substrate array by thin film vacuum deposition through a mechanical mask. The bumps formed by the deposition are then dipped in a solder bath.

U.S. Pat. No. 5,261,593 describes a method for connecting flip chips to flexible printed circuit boards. Solder paste is placed on the contact areas on the printed circuit board and solder bumps formed on the chips are brought into registration with the contacts, this assembly then heated to reflow the solder and form contacts between the chips and flexible circuit board.

U.S. Pat. No. 5,197,655 describes a process for applying solder to fine pitch leads. In one embodiment, solder paste is screened through an apertured mask onto land locations on a printed circuit substrate. A heated platen having an active element corresponding to the size and shape of the lands is then brought into contact with the solder paste to reflow the solder and form contacts on the lands. The heated platen is made of non-wettable material such as stainless steel or titanium.

U.S. Pat. No. 5,118,027 describes a process for attaching high melting point solder balls to contacts on a substrate through the use of low melting point solder paste. The solder balls are placed in cavities in an alignment boat that holds the solder balls in place through apertures connected to a vacuum source. The solder paste is then deposited on the solder balls through a metallic contact mask. A self-aligning plate is then placed over the boat and the substrate aligned on the plate so that the contact areas on the substrate are in contact with the solder paste. Pressure is applied to the substrate to assure firm contact with the paste. The self-aligning plate is then removed and the substrate, solder and alignment boat are fed through a low temperature furnace to solder the solder balls to the substrate through the solder paste. The substrate is then available for solder joining operations where the high temperature solder ball is soldered to a board or like structure. The solder paste screen is of stainless steel, brass or copper. Stainless steel is preferred because of its wear characteristics. The alignment boat is preferably made of graphite for its thermal conductivity and coefficient of expansion compatibility with a ceramic substrate.

U.S. Pat. No. 3,458,925 describes a process for forming mounds of solder on lands on an integrated circuit chip. A mask covers the surface of the chip except for the land and the immediately surrounding area and a layer of solder is evaporated onto the lands and surrounding area. The solder is then heated to a temperature above its melting point and the solder dewets the area around the lands and forms solder mounds on the lands.

The Advanced Packaging (Summer, 1993) article by David Hattas describes a "bump grid array" package which has an array of solder bumps formed on an epoxy-fiberglass resin printed circuit board. The bumps are formed from solder paste which is deposited on the substrate through a stencil. A solder paste that apparently overcomes slumping problems is used in addition to use of a nitrogen reflow oven to attempt to overcome problems with the unwanted formation of solder balls. The article does not disclose what material is used for the stencil although one would presume that it is a non-wettable material that would withstand soldering temperatures. In contrast, the invention provides that the relative width of the opening in the fixture relative to the width of the solder pad connector can be selected such that the solder wets to the pad and does not adhere to the fixture. The invention is therefore capable of forming solder balls of predetermined size. The size of the aperture is selected such that the fixture does not contact the solder ball after solder reflow. According to this article's design, direct screening without a physical barrier is limited to a certain pitch, with resulting volume variations. In sharp contrast, the fixture of the invention provides an exact volume of paste. The article also requires a specific, customized paste to be used and is thus not adaptable to ready usage of a variety of pastes, whereas the invention is capable of using a wide variety of solder pastes. The invention also makes it possible to alter the volume of the solder balls simply by altering the thickness of the fixture or the size of the apertures in the fixture. Finally, stencils such as those described in the Hattas article are incapable of releasing high volumes of solder at a fine pitch or in a tight area.

It is believed that a method of applying solder on a substrate which overcomes the aforementioned disadvantages which assure the aforedescribed distinctive advantages, among others, would constitute a significant avancement in the art.

DISCLOSURE OF THE INVENTION

A primary object of the present invention is to provide a method of forming solder balls on a substrate's contact grid in a relatively inexpensive yet highly reliable manner.

It is a further object of the invention to provide such a method which also enables circuit chips to be electrically connected to the substrate simultaneously with the formation of the solder ball contacts.

In accordance with one aspect of the present invention, there is provided a method of forming solder balls on a solderable surface on a substrate. The method includes positioning a fixture in aligned orientation with the substrate so that holes in the fixture are in substantial alignment with solderable surface positions on the substrate, filling the holes with solder paste, heating the fixture, solder paste and substrate so the solder paste forms solder balls that adhere to the solderable surfaces and detach from the fixture, and cooling the fixture and substrate, thereby leaving the solder balls in physical and electrical contact with the solderable surfaces on the substrate. The substrate is then separated from the fixture.

In accordance with another aspect thereof, the present invention also enables circuit chips to be simultaneously mounted on the side of the substrate opposite the solderable pads. The substrate is flipped and chips are placed in solderable contact with pads on the substrate. The fixture, substrate and chips are simultaneously heated to form both the solder balls and reflow solder on the pads.

BEST MODE FOR CARRYING OUT THE INVENTION

For a better understanding of the present invention, together with other and further objects, advantages and capabilities thereof, reference is made to the following disclosure and appended claims in connection with the above-described drawings.

With the continuing evolution of more complex and denser chip modules, it has become necessary to provide corresponding denser substrate connections. One approach to providing these is referred to in the industry as the Ball Grid Array (BGA), where solder balls are placed on a grid on the base of a substrate which in turn is capable of holding at least one, and preferably, a plurality of modules and/or semiconductor chips. Heretofore, placement of extremely small solder balls on such a substrate has required relatively complex (and expensive) equipment and processes in order to assure effective placement. In one approach, individual solder balls are picked and placed on the substrate, and is then solder reflowed. This process requires expensive "pick and place" equipment and is relatively time-consuming (and, therefore, expensive). Additionally, the required use of preformed solder balls adds more expense to such an operation. As acknowledged above, attempts have been made to form the solder connections on the substrate using solder paste and a corresponding mask. However, such processes have proven to be less than satisfactory, primarily because the mask proved difficult to remove and often resulted in broken connections. Still further, a new mask often had to be formed on each substrate, which is also expensive and time-consuming.

The present invention overcomes such problems by providing an easily removable holding fixture for holding the substrates while solder paste is squeegeed into apertures in the holding fixture. The solder paste is reflowed, significantly, while the substrate is held by the holding fixture. The fixture is formed of a material that is not wetted by the solder and which repels the solder so that it forms solder balls or bumps on the substrate. The molten solder used in the manner defined therein has a tendency to coagulate into a ball, particularly if exposed to a gaseous medium as also taught herein.

Figure 1:
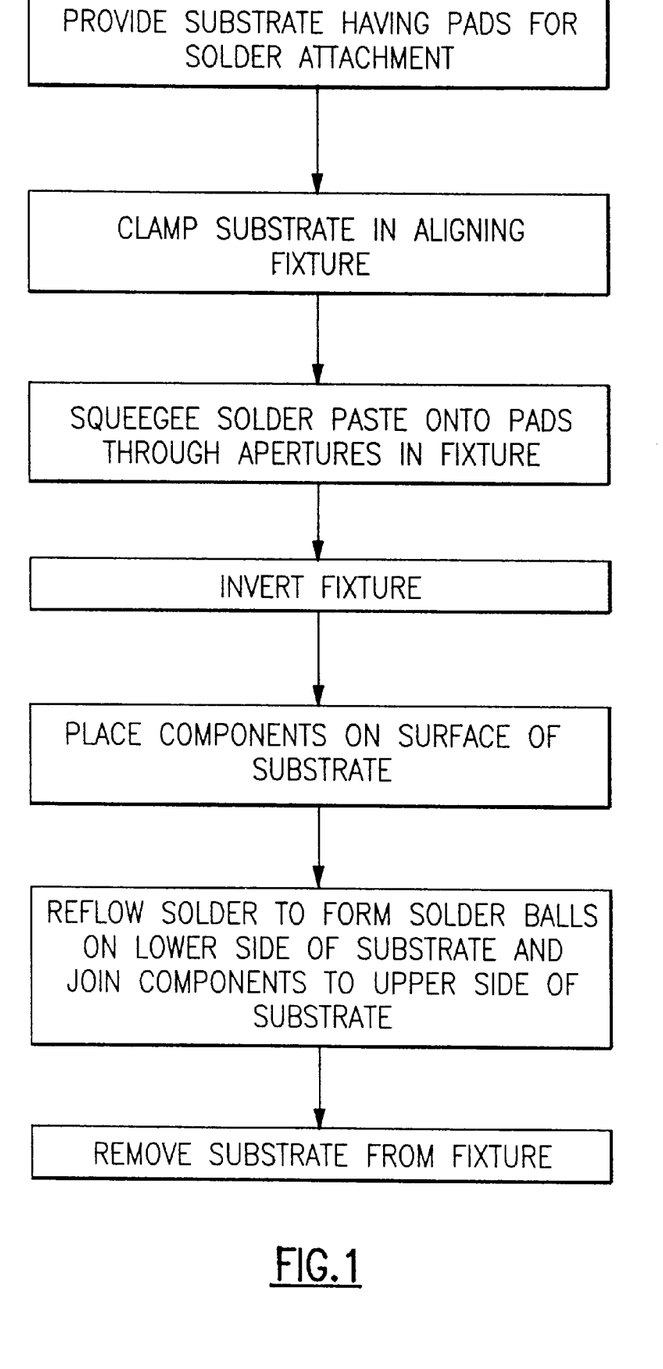
FIG. 1 is a diagram of the process flow of one embodiment of the invention.

FIG. 1 illustrates the process flow for forming BGAs in accordance with the present invention. As indicated, a substrate (which, in accordance with a preferred embodiment of the invention, includes both solder pads for attaching components or modules to the substrate on one side and a matrix array of solderable surfaces on the other side) is provided for processing. The substrate is clamped in a holding fixture that is fitted with alignment guides to properly orient the substrate in the holder. While the substrate is held in the fixture, a solder paste is squeegeed over the surface of the fixture and into apertures corresponding to the matrix array of solderable surfaces on the substrate.

After the solder paste is squeegeed onto the fixture, the fixture is inverted, and components are then placed on the upwardly facing surface of the substrate with the component connectors in contact with the substrate's solderable pads. The solder paste and solderable pads are now ready for solder reflow, during which the flux in the solder paste is driven off and the remaining solder repelled by the fixture such that it coagulates into solder balls on the substrate's circuit paths. Significantly, components on the upper surface of the substrate are simultaneously solder connected to the substrate's pads. After cooling, the substrate may now be removed from the fixture. Because the solder is repelled by the fixture, the integrity of the solder balls is easily retained. Specifically, the solder balls do not touch the internal walls of the fixture.

The above brief description highlights the steps of the process in accordance with one embodiment of the invention. The process of the invention will now be described in greater detail hereinbelow.

Figure 2A:
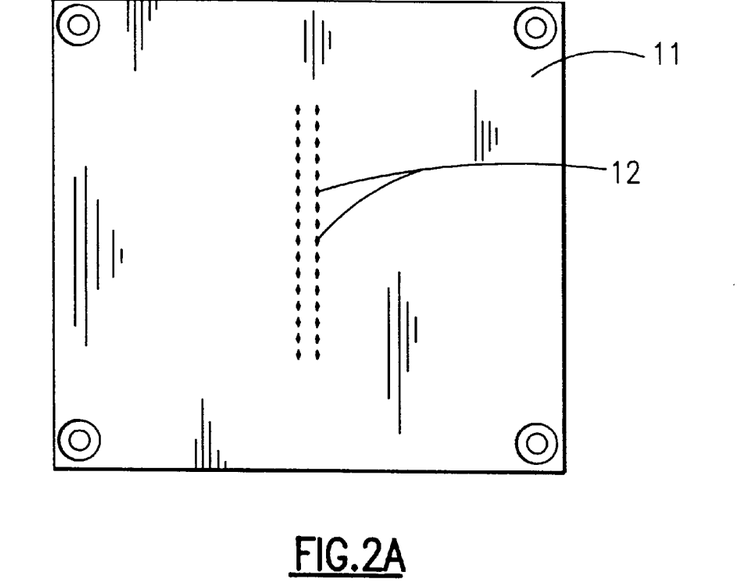
FIGS. 2A and 2B are plan views, illustrating a typical substrate that can be processed in accordance with the present invention.
Figure 2B:
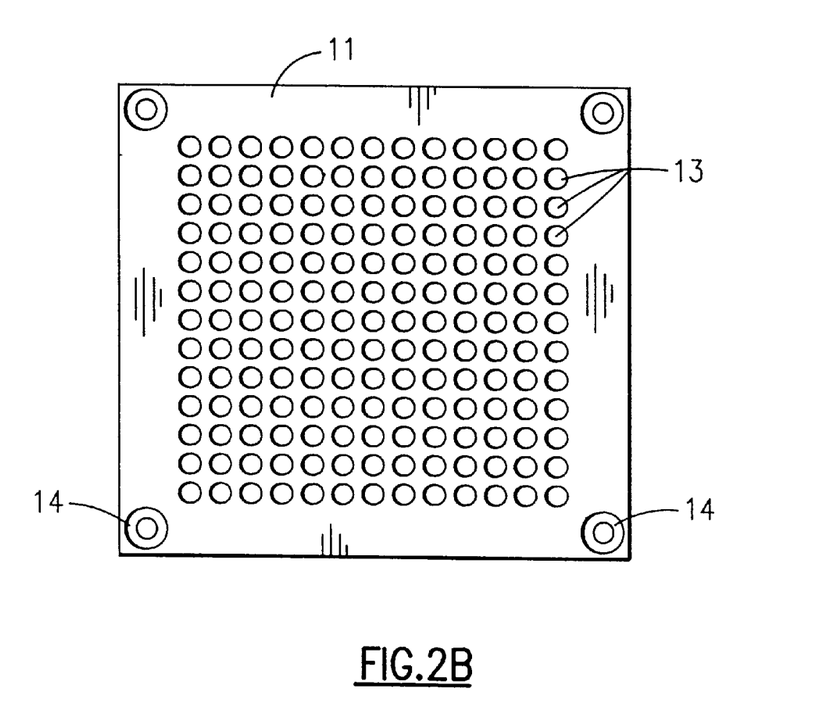

FIGS. 2A and 2B illustrate a typical BGA substrate 11 that may be processed in accordance with the teachings of the present invention. For ease of reference, the substrate surface receiving the components or modules (e.g., semiconductor chips) will be referred to as the upper surface of the substrate and the surface holding the solder balls will be referred to as the lower surface of the substrate. However, this orientation is not intended to limit the invention, as is understood from the teachings herein.

Substrate 11 may be made of any suitable, known printed circuit board material. Some examples include fiberglass-reinforced epoxy resins (commonly known as FR-4) and ceramic. The solder pads 12 on the upper surface may be formed of any solderable material such as copper, nickel, gold or tin-lead alloys.

The lower surface of the substrate includes a matrix of solderable surfaces (e.g., pads) 13 which may also be formed of any suitable solderable material such as those described above. The holes 14 at each corner of the substrate enable the substrate to be held in a properly aligned position in the holding fixture 15 (FIG. 3A), which may include pins (now shown) for this purpose.

Figure 3A:
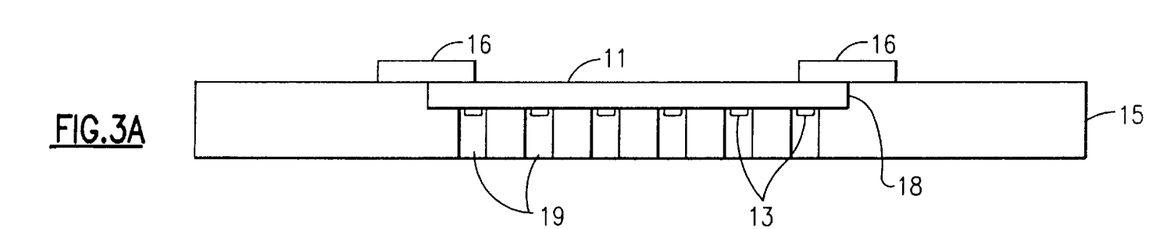
FIG. 3A is a side elevational view of the substrate in FIGS. 2A and 2B when mounted and aligned in a holding fixture in accordance with one embodiment of the invention.
Figure 3B:
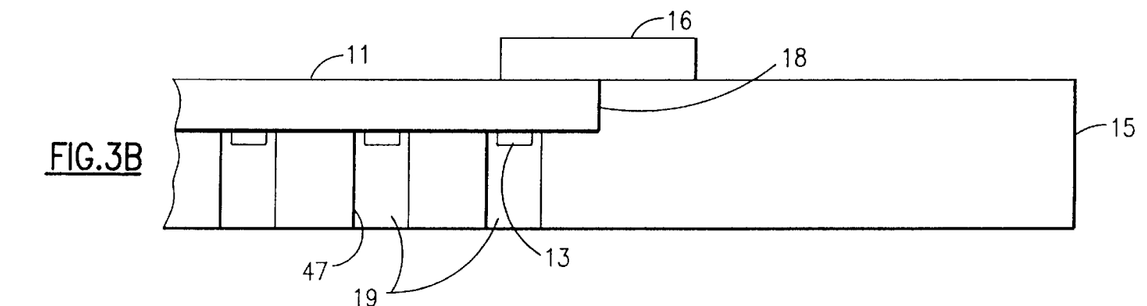
FIG. 3B is a partial, much enlarged view of a portion of the substrate and fixture shown in FIG. 3A.

As shown in FIGS. 3A and 3B, substrate 11 is held in fixture 15 by clamps 16 (schematically represented as blocks on the substrate's upper surface, which can simply comprise the top part of a C-clamp or the like, the other side (not shown) engaging the fixture's undersurface). The alignment holes 14 and the depression (opening) 18 in fixture 15 assure that the pads 13 are substantially centrally aligned with the apertures 19 in fixture 15. The alignment must be sufficient to enable the solder to reflow into a complete solder ball which is in contact with the pad on the substrate. The illustrated elongated body of fixture 15 is made of titanium or other durable material that will not make a wetting contact with the solder being used. The material used for the fixture must also be capable of withstanding the mechanical and thermal stresses inherent to the soldering process.

Figure 4:
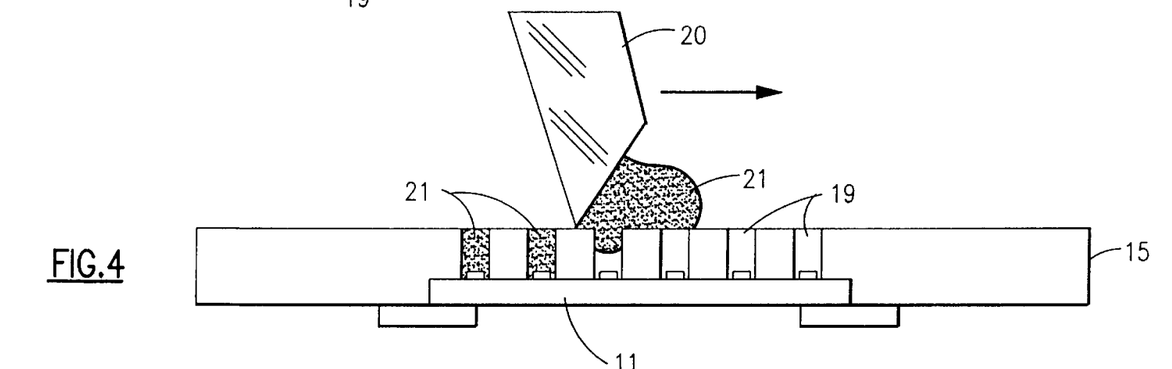
FIG. 4 illustrates the deposition of solder paste through apertures in the holding fixture of FIG. 3A.
Figure 5:
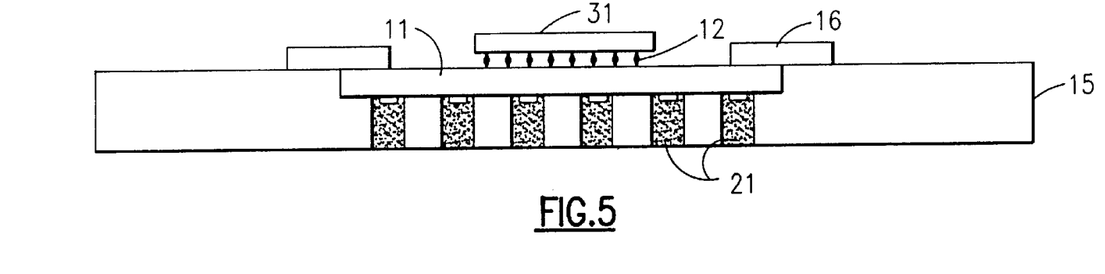
FIG. 5 shows a component mounted on the top side of the substrate while the substrate is held in the holding fixture of FIG. 4.

With substrate 11 held (clamped) in fixture 15, the substrate-fixture subassembly is inverted (FIG. 4) and solder 21 is squeegeed into apertures 19 by a squeegee blade 20 or the like. When apertures 19 are filled with solder paste, the subassembly is returned to its upright position (FIG. 5) and components 31 then placed on the solderable upper surface pads 12. In this upright position, fixture 15 is thus shown to include a body having a substantially planar upper surface (having the illustrated clamps 16 shown thereon) and an opposite, also substantially planar lower surface. Opening 18 (see FIG. 3A) is located in the top surface, while apertures 19 open along the opposite, bottom surface of this body. The substrate is now ready for heating to simultaneously reflow the solder paste 21 in apertures 19 and the solder on the pads 12 located on the substrate's opposite surface, both being achieved simultaneously.

Figure 6:
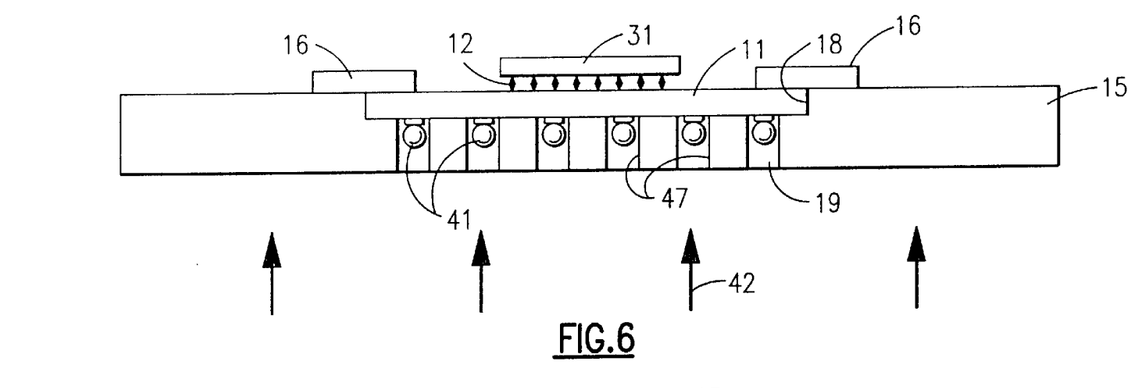
FIG. 6 illustrates the formation of solder balls and solder joints on the substrate while the substrate is held by the invention's holding fixture.

When heat (represented by arrows 42 in FIG. 6) heats solder paste 21, any flux in the paste is driven off and the remaining solder adheres to the substrate in the form of solder balls 41. Significantly, these solder balls 41 are not in contact with the internal walls 47 of the titanium fixture because the fixture effectively repels the solder in its molten form. Because there is no contact between the fixture's internal walls 47 and solder balls 41, it is thus relatively easy to separate the substrate from the fixture without damaging the extremely small solder ball connections. This heat thus heats the substrate, electronic component, fixture, and both solders to effect the simultaneous solder connections taught herein.

Figure 7:
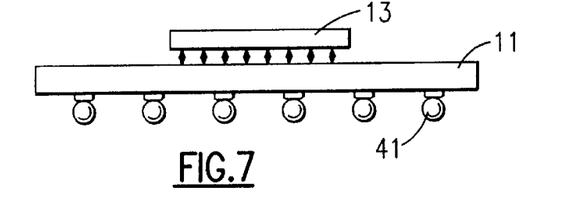
FIG. 7 illustrates the substrate (with solder balls and attached component) as formed in accordance with the above steps, when removed from the invention's fixture.

FIG. 7 shows the completed substrate 11 with the solder balls (to form connectors to a corresponding substrate or the like) 41 on the lower side of substrate 11 and at least one component 31 (e.g., a semiconductor chip) electrically attached (also by solder) to the substrate's upper surface. Both solder connections are thus simultaneously formed in accordance with the teachings of this invention.

Figure 8A:
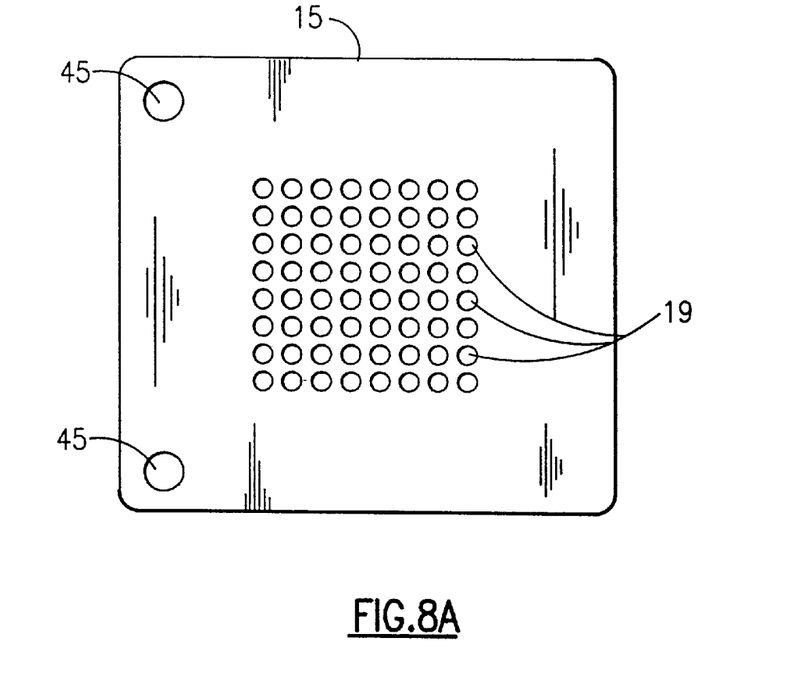
FIGS. 8A and 8B are plan views of a holding fixture in accordance with a preferred embodiment of the invention.
Figure 8B:
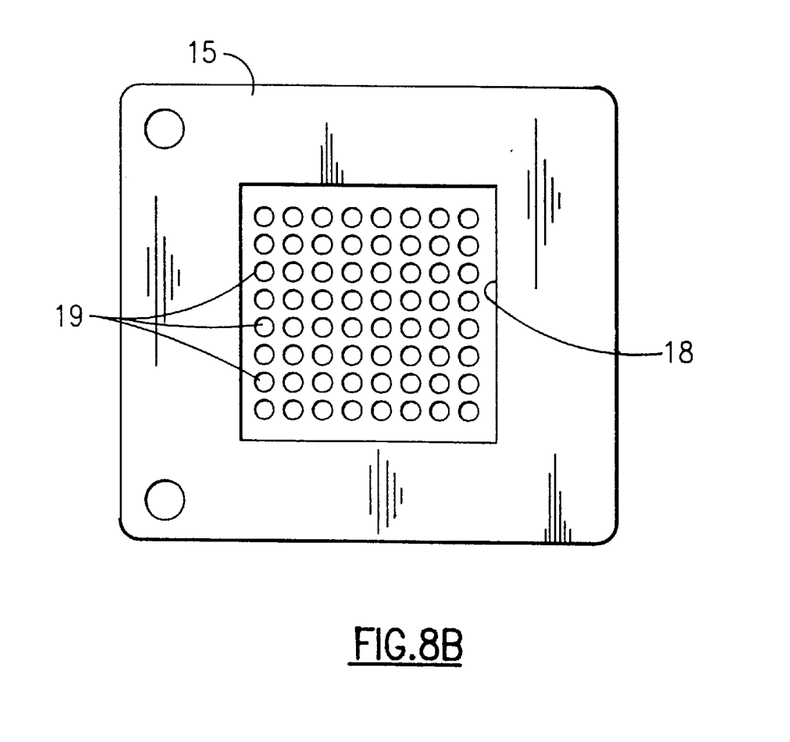

FIGS. 8A and 8B represent lower and upper surface plan views, respectively, of the titanium holding fixture 15. The tooling holes 45, as stated, enable fixture 15 to be properly aligned in a mounting device (not shown). The recessed pocket 18 (see also FIG. 6) in the upper surface of fixture 15 aligns the fixture's holes (19) with the solder pads 13 on the substrate's bottom (under) surface.

The Joint Electron Device Engineering Council (JEDEC) has established certain standards for the size of solder balls acceptable for use with electronic chip devices. Significantly, the present invention enables the volume and size of the solder balls to be predetermined while at the same time enabling the balls to be formed in the unique manner taught herein.

Figure 9:
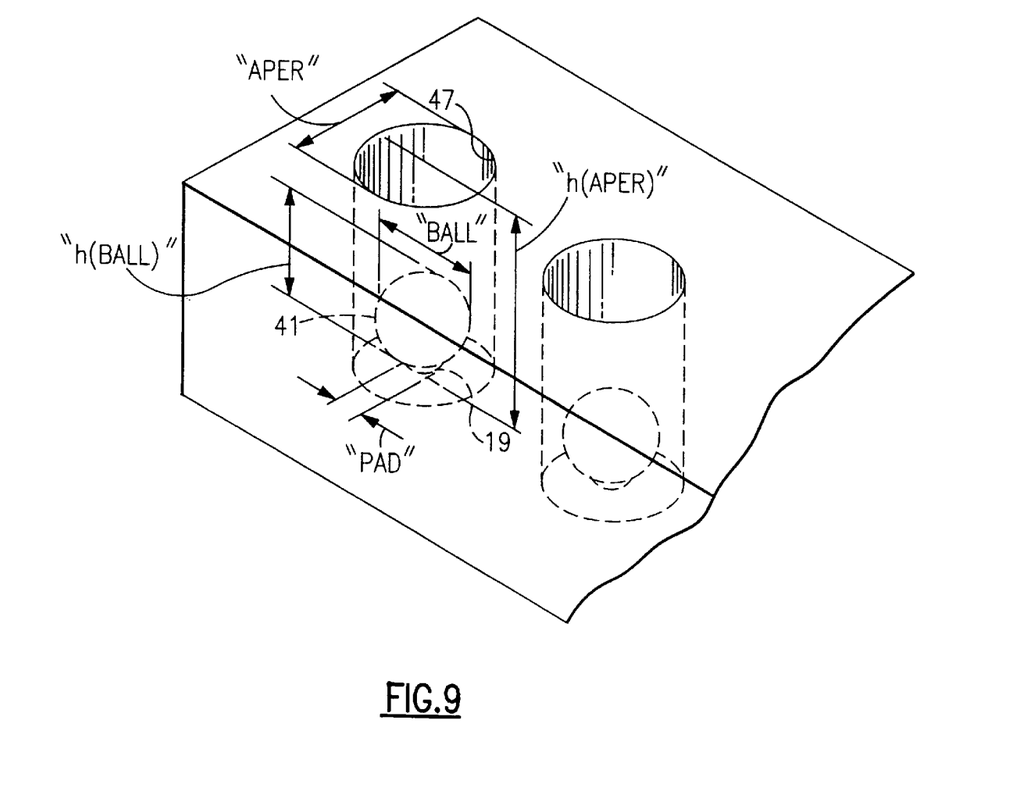
FIG. 9 is a schematic representation, in perspective, of a portion of the invention's fixture, comparing the relative sizes of the desired pad and fixture apertures.

FIG. 9 shows schematically the dimensions of a fixture that can be designed so as to form a solder ball of a desired size using a solder paste of a particular composition. As shown in FIG. 9, the diameter (dimension "APER") and height "h(APER)" of the apertures in the fixture serves to determine the volume of solder paste that can be associated with the solderable pad aligned with each aperture and, therefore, determine the final dimensions of the solder ball. The solder ball's final diameter (dimension "BALL") is shown as being less than the corresponding aperture diameter. The underlying pad's diameter (dimension "PAD") is less than the ball's diameter.

Figure 10A:
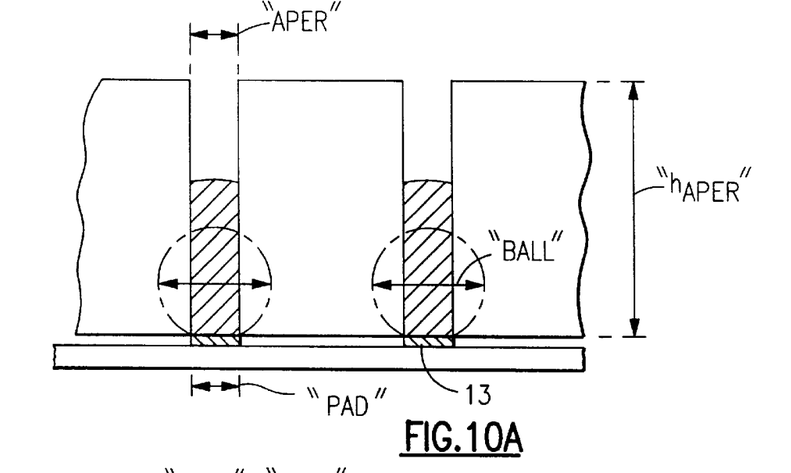
FIGS. 10A to 10D are partial elevational views which illustrate solder connections which may be formed on a substrate using different size fixtures.
Figure 10B:
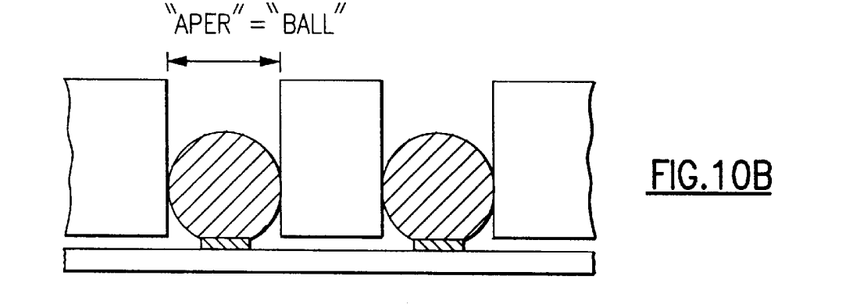
Figure 10C:
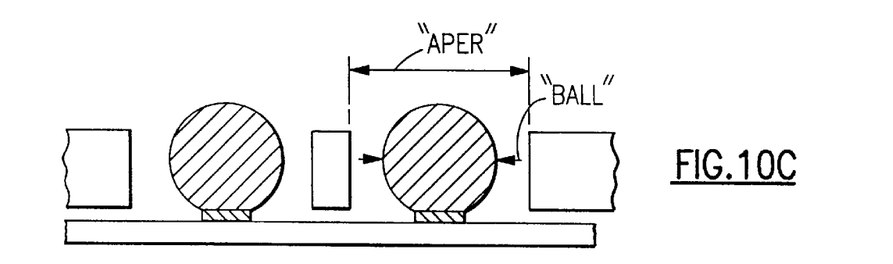
Figure 10D:
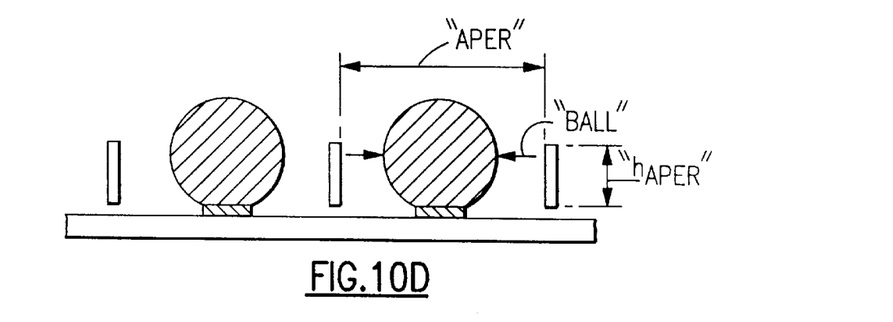

FIGS. 10A through 10D illustrate schematically four different fixture apertures relative to final ball size. In FIG. 10A, the aperture is both too narrow and too high with the consequent result that a solder ball is not formed. Instead, a tall, thin solder column or pin is constructed which, if used, would readily break away at pad 13. FIG. 10B illustrates a situation where the solder ball is formed but the width of the aperture is too narrow (e. g., the aperture and ball diameter are similar). The surface of the solder ball is too close to the wall of the aperture so the solder ball may be easily displaced or broken during fixture removal. FIG. 10C illustrates the optimum situation. Here the solder ball is formed in good contact with the solderable pad and has sufficient clearance from the walls of the aperture to enable the fixture to be easily removed without disturbing the solder balls. FIG. 10D illustrates the situation where the aperture is too wide. In this situation, the solder balls may not make good contact with the solderable pads or may actually slump (both are shown in position, however, in FIG. 10D for illustration purposes). Obviously, it is necessary to control the thickness of the fixture and the diameter of the apertures to assure that solder balls of the desired size and shape are formed. An additional factor that must also be considered is the ratio of solder to flux in the solder paste. The amount of flux used must be kept below a certain maximum to be assured that sufficient solder is available to form the desired solder ball. This ratio determines the amount of solder available to form the solder ball and, therefore, in conjunction with the aperture height and diameter, determines the solder ball size.

A preferred solder paste is a eutectic tin/lead composition, the most preferred composition being 63% tin and 37% lead (known also as 63:37 tin: lead solder). The preferred range of soldering temperature is between 25 and 350 degrees Celsius. The length of time of the soldering cycle is directly proportional to the temperature used.

Although the methods of the present invention have been primarily described with respect to forming contacts in a ball grid array, it is not intended that the invention be limited solely to this type of array. The invention can obviously be applied to any contact arrangement that requires the use of solder balls or the like. The present invention is intended to include all embodiments amenable to forming contacts in the manner described and as defined by the following claims.

While there have been shown and described what are at present considered embodiments of the invention, it will be obvious to those skilled in the art that various changes and modifications can be made therein without departing from the scope of the invention as defined by the appended claims.

What is claimed:

1. A fixture for holding a substrate having a plurality of solder pads thereon during processing of said substrate, said fixture comprising:

a body of material not wettable by solder having a first opening in a first surface of said body and a plurality of second openings in a second, opposing surface of said body, each of said second openings being smaller than said first opening in said first surface, said fast opening adapted for having a substrate having a plurality of solder pads thereon positioned within said first opening such that said solder pads are individually aligned with respective ones of said second openings, said second openings of a predetermined size and configuration such that when solder paste is located therein and reflowed while said second openings face in a downward direction, said solder paste within said downwardly facing second openings will be repelled from the internal walls of said second openings and will form into a plurality of solder balls each having a diameter less than the diameter of said second openings with each of said solder balls coupled to a respective one of said solder pads upon said substrate; and means adapted for retaining said substrate within said first opening of said body during the reflow of said solder paste.

2. The fixture of claim 1 wherein said material of said body is comprised of titanium.

3. The fixture of claim 1 wherein said body includes at least two holes therein for enabling said body to be aligned within a mounting device.

4. The fixture of claim 1 wherein said means for retaining said substrate within said first opening of said body comprises at least one clamp for engaging a surface of said substrate while said substrate is positioned within said first opening.

* * * * *